(12) United States Patent
Tiku et al.

(10) Patent No.: US 6,596,635 B1
(45) Date of Patent: Jul. 22, 2003

(54) METHOD FOR METALLIZATION OF A SEMICONDUCTOR SUBSTRATE

(75) Inventors: Shiban K. Tiku, Camarillo, CA (US); Heather L. Knoedler, Thousand Oaks, CA (US); Richard S. Burton, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/269,729

(22) Filed: Oct. 11, 2002

Related U.S. Application Data

(62) Division of application No. 10/163,662, filed on Jun. 4, 2002.

(51) Int. Cl.[7] .............................................. H01L 21/44
(52) U.S. Cl. ...................................................... 438/674
(58) Field of Search ................................. 438/597, 604, 438/628, 644, 674

(56) References Cited

U.S. PATENT DOCUMENTS

| | | | |
|---|---|---|---|
| 4,737,839 A | * | 4/1988 | Burt ............................ 357/67 |
| 5,365,790 A | * | 11/1994 | Chen et al. .................. 73/724 |
| 6,140,703 A | * | 10/2000 | Cronin et al. ............... 257/766 |
| 6,222,207 B1 | * | 4/2001 | Carter-Coman et al. ...... 257/98 |

* cited by examiner

*Primary Examiner*—David Nelms
*Assistant Examiner*—Quoc Hoang
(74) *Attorney, Agent, or Firm*—Farjami & Farjami LLP

(57) ABSTRACT

According to one embodiment, an NiV adhesion layer is deposited over the backside surface of a semiconductor substrate. The semiconductor substrate might comprise a group III–V compound semiconductor. The NiV adhesion layer can be deposited over the backside surface of the semiconductor substrate in, for example, a magnetron deposition system. In certain embodiments, the backside surface of the semiconductor surface may be cleaned to remove oxides from the surface prior to deposition of the NiV adhesion layer. After the NiV adhesion layer has been deposited, a gold seed layer is deposited over the NiV adhesion layer. Following deposition of the gold seed layer, a second gold layer is electroplated, or otherwise deposited, over the gold seed layer. In one embodiment, the invention is a structure fabricated according to the process steps described above.

23 Claims, 4 Drawing Sheets

METHOD FOR METALLIZATION OF A SEMICONDUCTOR SUBSTRATE

This application is a Divisional of application Ser. No. 10/163,662 filed Jun. 4, 2002.

BACKGROUND OF THE INVENTION

1. Field of the Invention

The present invention is generally in the field of semiconductor fabrication. More particularly, the present invention is in the field of metallization for semiconductor substrates.

2. Related Art

Metallization refers to the process of depositing metal on the surface of a semiconductor substrate or other layers existing on the semiconductor substrate. Of particular interest in semiconductor fabrication is "backside metallization" which refers to the process of depositing metal on the backside surface of a semiconductor substrate. Although throughout the present application reference is made to the specific example of "backside metallization" to describe the related art as well as the advances made by the present invention, it is appreciated by a person of ordinary skill in the art that the shortcomings of the related art described herein, as well as the solution provided by the present invention, apply to metallization of large areas of a semiconductor die, whether such large areas are on the backside or frontside of the die, or whether such large areas contain features such as trenches, dips, holes, tubs, ridges, mesas, or are featureless and plane.

Continuing with the specific example of backside metallization, it (i.e. backside metallization) may be implemented in semiconductor fabrication to realize a number of goals including, for example, improved thermal conductivity by way of an effective outlet for heat dissipation from the die. Backside metallization is also frequently used for reducing inductance, as well as other electrical advantages. As an example of backside metallization, a backside layer of gold is typically used to attach a die to its package by eutectic techniques where the layer of gold also provides the thermal and electrical advantages mentioned above.

The formation of a strong bond between a metal layer and the substrate backside surface is important for a variety of reasons. For example, a strong bond is necessary to prevent peeling of the metal layer, and in particular the backside metal layer, from the substrate during subsequent processing steps. One concern, for instance, is the backside metal layer's susceptibility to peeling during die separation, which may involve scribe-and-break steps, or during die pick. If the bond is not sufficiently strong, peeling may also occur when the die is bonded during the die attach process. Such processes subject the die to mechanical forces that can compromise the bond between the backside metal layer and the semiconductor substrate, leading to low yield and throughput, or may ultimately affect the performance and durability of the die.

The bond achieved by backside metallization techniques known in the art have proven inadequate and/or impractical, most notably when backside metallization is performed on group III–V compound semiconductors, such as gallium-arsenide, indium-phosphide, or gallium-nitride, for example. In U.S. Pat. No. 4,946,376, titled "Backside Metallization Scheme for Semiconductor Devices," for example, a backside metallization process is disclosed wherein the backside metal layer comprises a layer of vanadium deposited over the backside of the wafer and a layer of silver disposed over the vanadium. According to this scheme, the vanadium layer acts as the adhesion layer. Another method for backside metallization is disclosed in U.S. Pat. No. 6,140,703, titled "Semiconductor Metallization Structure," wherein a layer of titanium is used as the adhesion layer, while a nickel-vanadium layer, deposited over the adhesion layer, functions as a barrier layer.

Other known schemes use a combination of Ti/Pt/Au, Ti/Au or Ti/Ni/Au for metallization. According to the scheme, adhesion of the metal layer to the substrate surface is provided by Ti, which does not react well with group III–V compounds, and the adhesion relies primarily on oxide formation. However, oxides on group III–V compounds are poorly bonded to the substrate, and as such, this scheme results in a backside metal layer that is prone to peeling. For at least the same reason, a known scheme using Cr/Au, with Cr being the glue layer, is inadequate, since it also relies on oxide formation. Other known backside metallization methods may utilize other materials and compositions of materials, but each has its own drawbacks, and none has led to the level of reliability desired.

The need for well adhering backside metallization is magnified in instances where the backside of the semiconductor substrate includes various features, rather than being flat or featureless. For example, some manufacturers implement Through Wafer Vias ("TWV") into their chips. TWV, which may also be referred to as "backside vias", are vias etched from the backside of the wafer through the semiconductor substrate and other intervening layers to land on a desired metal layer or component in the chip, such as a ground pad. TWV can provide both thermal and electrical advantages, including reducing electrical resistance and inductance, and lowering thermal resistance, which permit manufacturers to produce chips having higher power efficiency on smaller die sizes. The presence of such features, including TWV, makes it more difficult to deposit the adhesion and seed layers properly for strong bonding between the backside metal layer and the backside substrate surface, consequently leading to a higher manufacturing defect rate due to, for example, peeling.

There is thus need in the art for an effective and reliable method for metallization of large areas in a semiconductor substrate and, in particular, for backside metallization of group III–V compound semiconductors and related structure.

SUMMARY OF THE INVENTION

The present invention is directed to method for metallization of a semiconductor substrate and related structure. In particular, various embodiments of the present invention overcome the need in the art for an effective and reliable method for metallization of large areas in a semiconductor substrate and, in particular, for backside metallization of group III–V compound semiconductors and related structure. Although throughout the present application reference is made to the specific example of "backside metallization" to describe the present invention, it is appreciated by a person of ordinary skill in the art that the principles of the present invention apply to metallization of large areas of a semiconductor die, whether such large areas are on the backside or frontside of the die, or whether such large areas contain features such as trenches, dips, holes, tubs, ridges, mesas, or are featureless and plane.

According to one embodiment, a nickel-vanadium ("NiV") adhesion layer is deposited over the backside surface of a semiconductor substrate. The semiconductor substrate might comprise a group III–V compound semiconductor, such as gallium-arsenide, indium-phosphide or gallium-nitride. The NiV adhesion layer might comprise, for example, approximately 93% nickel and 7% vanadium, or generally anywhere from 100% to 80% nickel and 0% to 20% vanadium. The NiV adhesion layer can be deposited over the backside surface of the semiconductor substrate in, for example, a magnetron deposition system, and can be between approximately 30 and 2000 Angstroms thick. In certain embodiments, the backside surface of the semiconductor surface may be cleaned to remove oxides from the surface prior to deposition of the NiV adhesion layer.

After the NiV adhesion layer has been deposited, a gold seed layer is deposited over the NiV adhesion layer. As an example, the gold seed layer can be between approximately 100 and 2500 Angstroms thick. Following deposition of the gold seed layer, a second gold layer is electroplated over the gold seed layer. The second gold layer can also be deposited by other techniques known in the art. The second gold layer can be between approximately 0.5 and 25 microns thick, for example. A backside metal layer comprising an NiV adhesion layer, a gold seed layer, and a second gold layer can thus be effectively achieved.

In one embodiment, the invention is a structure fabricated according to the process steps described above. Other features and advantages of the present invention will become more readily apparent to those of ordinary skill in the art after reviewing the following detailed description and accompanying drawings.

DETAILED DESCRIPTION OF THE INVENTION

The present invention is directed to method for metallization of a semiconductor substrate and related structure. The following description contains specific information pertaining to the implementation of the present invention. One skilled in the art will recognize that the present invention may be implemented in a manner different from that specifically discussed in the present application. For example, although throughout the present application reference is made to the specific example of "backside metallization"to describe the present invention, it is appreciated by a person of ordinary skill in the art that the principles of the present invention apply to metallization of large areas of a semiconductor die, whether such large areas are on the backside or frontside of the die, or whether such large areas contain features such as trenches, dips, holes, tubs, ridges, mesas, or are featureless and plane. Moreover, some of the specific details of the invention are not discussed in order to not obscure the invention. The specific details not described in the present application are within the knowledge of a person of ordinary skill in the art.

The drawings in the present application and their accompanying detailed description are directed to exemplary embodiments of the invention only. To maintain brevity, other embodiments utilizing the principles of the present invention are not specifically described in the present application and are not specifically illustrated by the present drawings.

Figure 1:
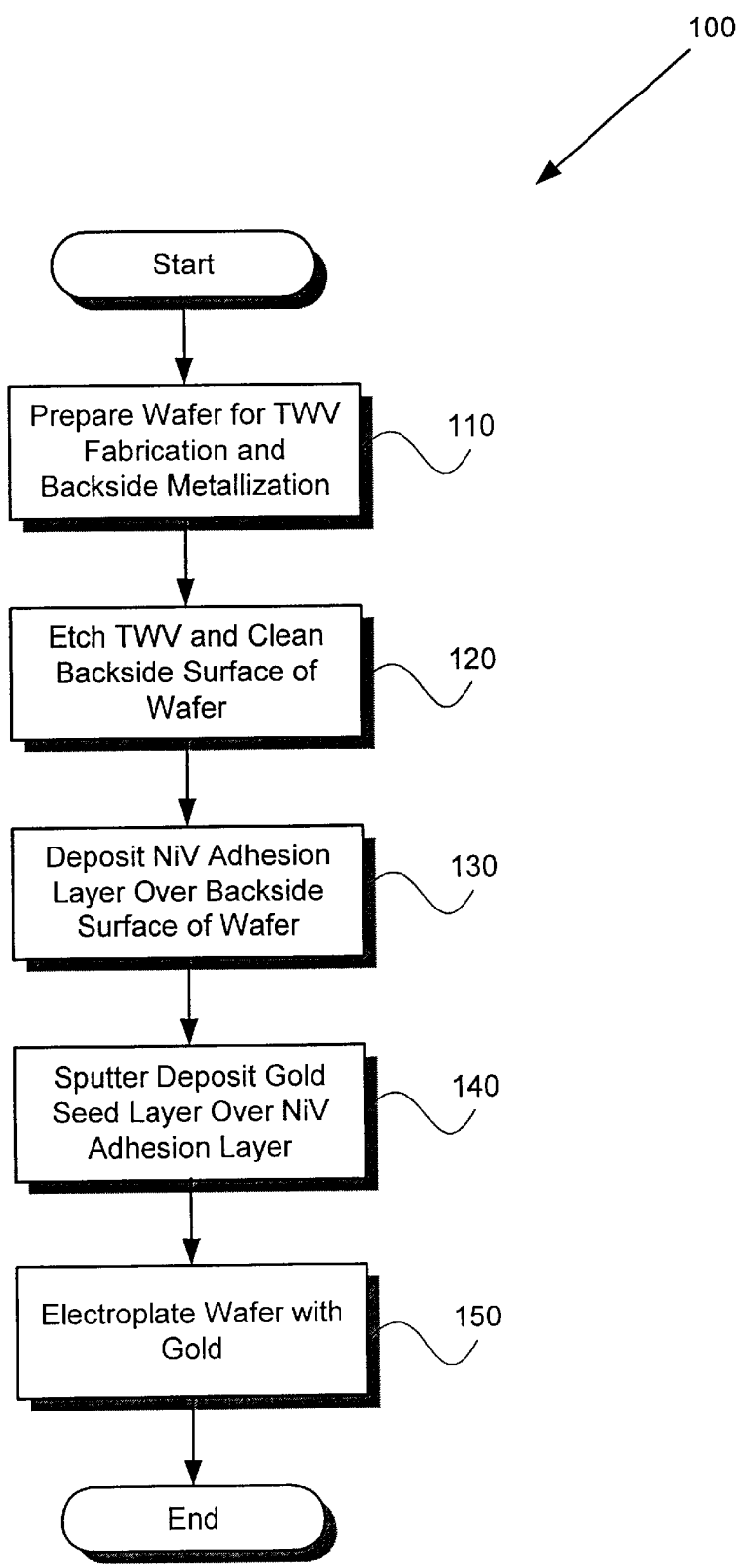
FIG. 1 shows a flowchart illustrating the steps taken to implement an embodiment of the invention.

Reference is now made to flowchart 100 in FIG. 1, which illustrates an exemplary process for backside metallization in a group III–V compound semiconductor, in accordance with one embodiment of the present invention. Certain details and steps have been left out of process 100 which are apparent to a person of ordinary skill in the art. For example, a step may consist of one or more substeps or may involve specialized equipment, as known in the art. Steps 110 through 150 indicated in flowchart 100 are sufficient to describe one embodiment of the present invention, and it is noted that other embodiments may use steps different from those shown in flowchart 100.

Figure 2A:
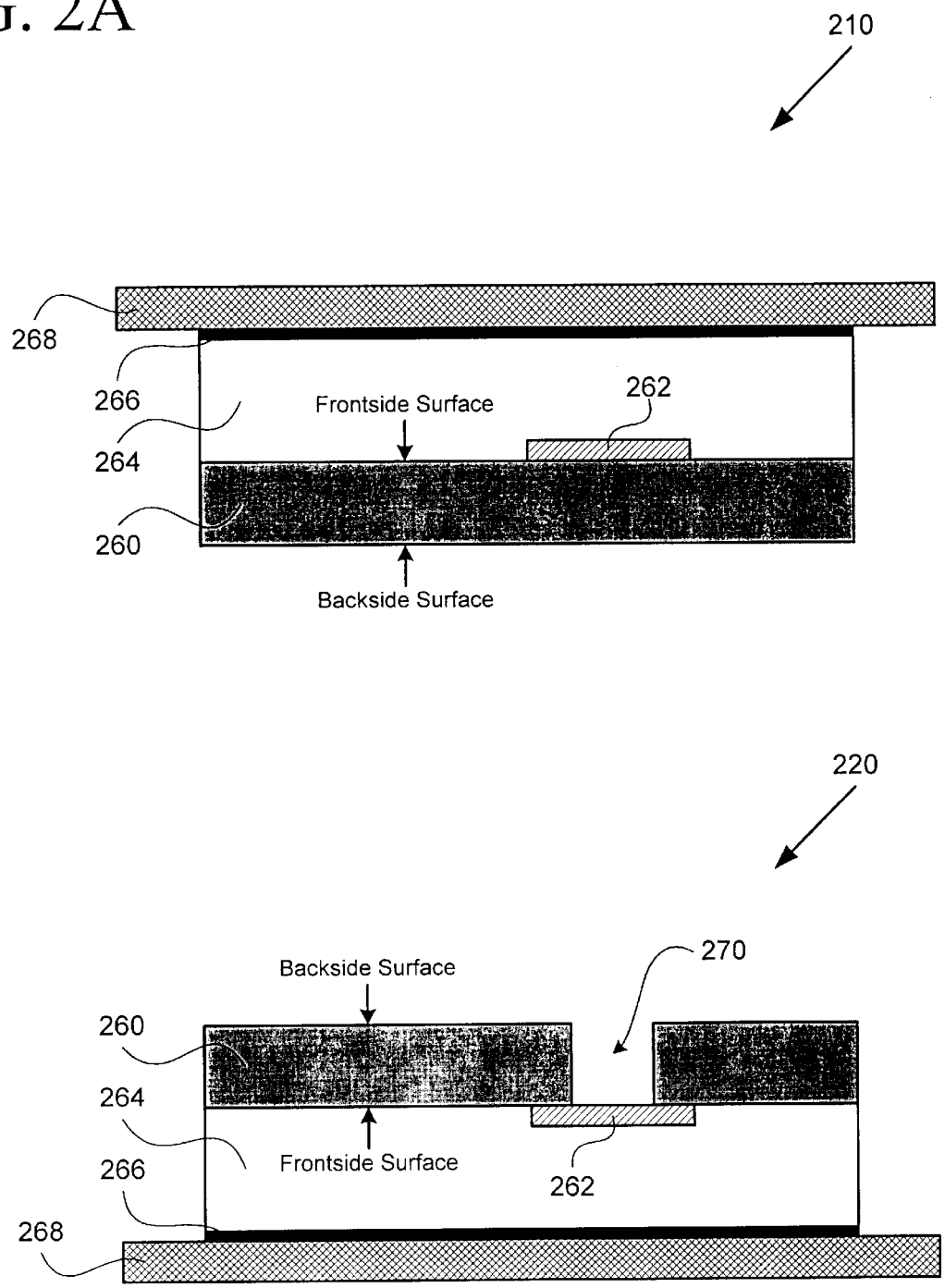
FIG. 2A illustrates cross sectional views, which include portions of a wafer processed according to an embodiment of the invention,corresponding to certain steps of FIG. 1.

Referring now to structure 210 in FIG. 2A, illustrated is a cross-section of a segment of a wafer, i.e. wafer 260, at a processing step that corresponds to step 110 of flowchart 100 in FIG. 1. Thus, referring to step 110 of flowchart 100 and structure 210 of FIG. 2A, wafer 260 is at a stage where fabrication of a through wafer via ("TWV") and backside metallization may next occur. Wafer 260, which is also referred to as "substrate 260" in the present application, might comprise, for example, a group III–V compound semiconductor, such as gallium-arsenide, indium-phosphide, gallium-nitride, indiumarsenide, or gallium-antimony. However, the principles of the present invention are applicable to other compound semiconductors as well. As shown, wafer 260 has a frontside surface and a backside surface. Situated on the frontside surface of wafer 260 is exemplary ground pad 262, which can be fabricated in a manner known in the art. It is appreciated that other elements, components and devices may be present in or on wafer 260 but are not shown in order to not obscure the present invention.

Continuing with structure 210 of FIG. 2A, the frontside of wafer 260, having ground pad 262, is coated with protective polymer coating 264, which can comprise PGMI, for example. Coated wafer 260 is then attached with wax 266 to sapphire substrate 268, which provides support for wafer 260 and prevents breakage of wafer 260 in subsequent processing steps. Structure 210 thus shows wafer 260 that has been prepared for TWV fabrication and backside metallization, according to step 110 of flowchart 100.

Figure 2B:
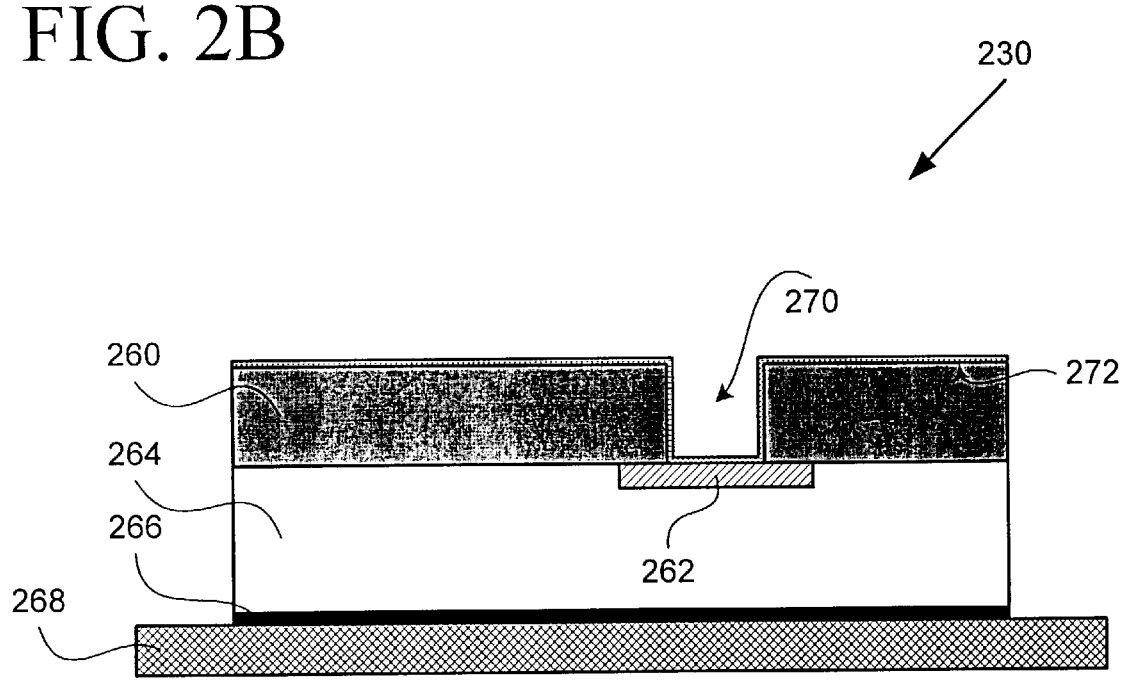
FIG. 2B illustrates cross sectional views, which include portions of a wafer processed according to an embodiment of the invention, corresponding to certain steps of FIG. 1.
Figure 2B:
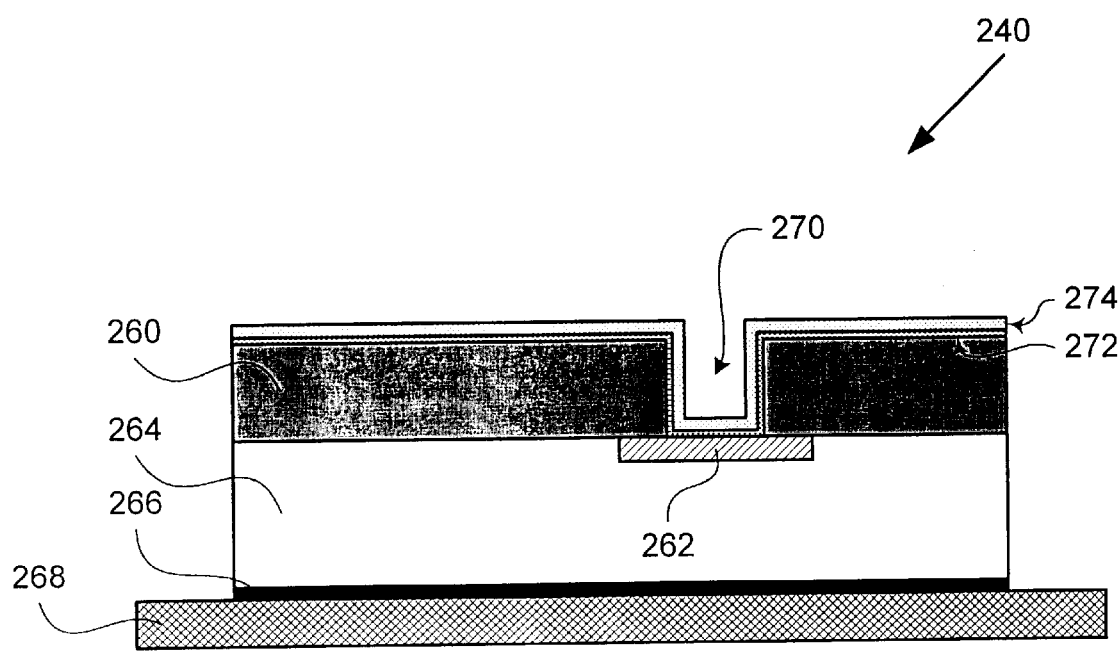
Figure 2C:
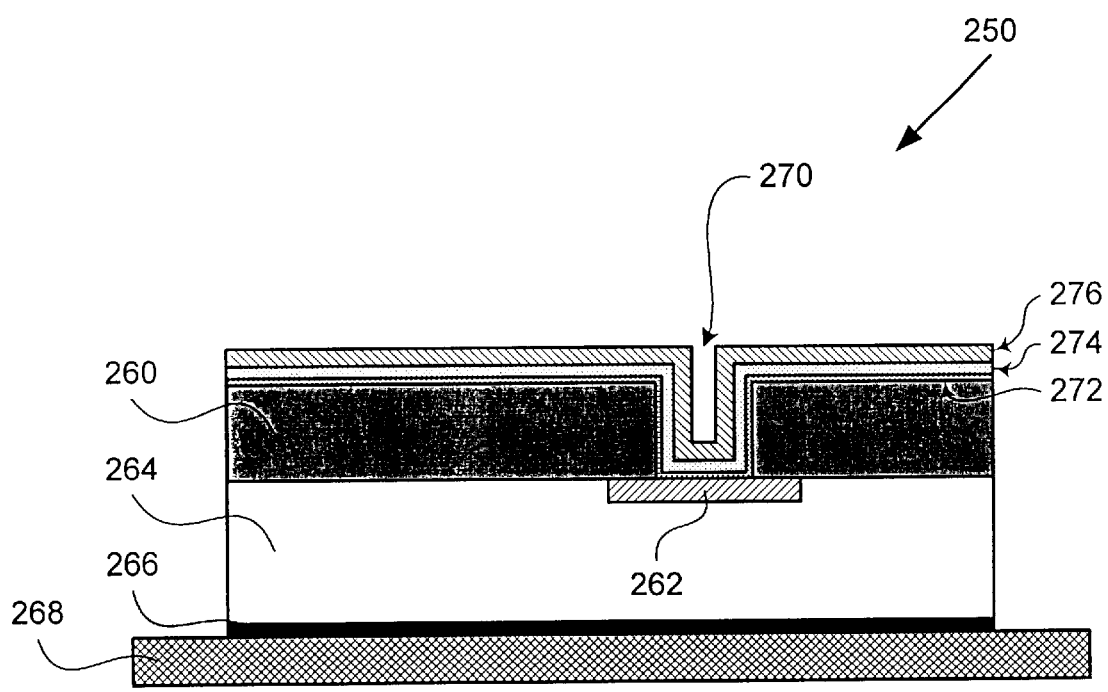
FIG. 2C illustrates a cross sectional view, which include portions of a wafer processed according to an embodiment of the invention, corresponding to a certain step of FIG. 1.

Referring now to steps 120 through 150 of flowchart 100 in FIG. 1 and to structures 220 through 250 in FIGS. 2A, 2B and 2C, it is noted that each structure shown in FIGS. 2A, 2B and 2C corresponds to a step in flowchart 100 and illustrates the successive processing of wafer 260 according to the present embodiment. Thus, structure 220 shows structure 210 following application of step 120 of flowchart 100. Similarly, structure 230 shows structure 220 following application of step 130 of flowchart 100, and so on.

Referring now to step 120 of flowchart 100 and the corresponding resulting structure 220 in FIG. 2A, it is noted that the view has been rotated 180O, such that the frontside surface of wafer 260 is now shown as being "beneath" the backside surface of wafer 260. Structure 220 shows structure 210 following the application of step 120 of flowchart 100, wherein TWV 270 is etched into wafer 260 to allow contact with ground pad 262. TWV 270, which can provide a primary path for heat dissipation and can be fabricated using suitable photolithography methods known in the art. Thus, the present embodiment of the invention is directed to backside metallization of a wafer having a feature, e.g. TWV 270, but it is appreciated that the advantages of the present invention can also be realized where the backside metallization is performed on a wafer that is flat or featureless.

Also at step 120 of flowchart 100, following the fabrication of TWV 270, the surface of wafer 260 is cleaned to dissolve any oxides that may be present. For example, a standard wet clean method using a 1:1 HCl/water bath may be employed, wherein wafer 260 is immersed in the bath for approximately 30 seconds. Alternatively, a dry clean method, such as an ion or sputter clean method using argon, may be utilized to remove oxide from the backside surface of wafer 260.

Referring now to step 130 of flowchart 100 and corresponding structure 230 in FIG. 2B, an adhesion layer, i.e. NiV adhesion layer 272, is deposited over the backside surface of wafer 260, including the walls of TWV 270. Structure 230 in FIG. 2B thus shows structure 220 following the application of step 130 of exemplary process 100. In the present embodiment, adhesion layer 272 comprises nickel-vanadium ("NiV") at a composition of approximately 93% nickel and approximately 7% vanadium, or generally a composition having anywhere from 100% to 80% nickel and 0% to 20% vanadium. One objective is to introduce a sufficient amount of vanadium such that the target comprising nickel becomes sufficiently non-magnetic depending on the deposition system being used. For example, a 93% nickel-7% vanadium target is non-magnetic and can be used in a magnetron sputter deposition system to achieve a high deposition rate. Thus, NiV adhesion layer 272 can be deposited using, for example, an RF magnetron deposition system, although other deposition means known in the art may also be used. For example, NiV adhesion layer 272 can be deposited in DC magnetron, RF diode, and ion beam sputter deposition systems, or an electron beam deposition system. NiV adhesion layer 272 can be in the range of approximately 30 Angstroms to approximately 2000 Angstroms thick, deposited at a high power density, e.g. between approximately 4 W/cm$^2$ and approximately 12 W/cm$^2$, and at a low pressure, e.g. between approximately 1 mtorr and approximately 3 mtorr. The high power density and low pressure environment promotes a stronger bond to form between the backside surface of wafer 260 and NiV adhesion layer 272.

Following the deposition of NiV adhesion layer 272 over the backside surface of wafer 260, exemplary process 100 continues at step 140 and corresponding structure 240 in FIG. 2B, where a seed layer is deposited over NiV adhesion layer 272. Thus, structure 240 in FIG. 2B shows structure 230 following the application of step 140 of exemplary process 100. In the present embodiment, seed layer 274 comprises gold and can be, for example, approximately 100 to 2500 Angstroms thick. Gold seed layer 274 can be deposited in a manner known in the art. For example, gold seed layer 274 can be deposited by utilizing various deposition systems such as RF magnetron, DC magnetron, RF diode, and ion beam sputter deposition systems, or by utilizing an electron beam deposition system.

Referring now to step 150 of flowchart 100 and corresponding structure 250 illustrated in FIG. 2C, a layer of gold, i.e. gold layer 276, is next plated or otherwise deposited over gold seed layer 274. Thus, structure 250 in FIG. 2C shows structure 240 in FIG. 2B following the application of step 150 of exemplary process 100. As shown in structure 250, gold layer 276 is thicker than NiV adhesion layer 272 or gold seed layer 274, and can be between approximately 0.5 microns and approximately 25 microns thick. Gold layer 276 can be fabricated in a suitable manner known in the art, for example by electroplating in a commercial gold plater, or by utilizing other deposition systems such as RF magnetron, DC magnetron, RF diode, and ion beam sputter deposition systems, or by utilizing an electron beam deposition system.

Exemplary process 100 for backside metallization of a group III–V compound semiconductor ends following the formation of gold layer 276. It is appreciated, however, that processing steps subsequent to backside metallization of wafer 260 may involve such processes as scribe-and-break, die pick and die attach, for example, which subject wafer 260 to a host of mechanical stresses. These mechanical stresses can lead to peeling of the backside metal if the bond between the backside metal and the backside surface of wafer 260 is not sufficiently strong. The present invention, as described above, provides for an effective backside metallization process that significantly reduces the threat of backside metal peeling. As a result, manufacturers can achieve greater yield and throughput, and the final product, i.e. the final semiconductor chip, is more durable.

From the above description of the invention it is manifest that various techniques can be used for implementing the concepts of the present invention without departing from its scope. For example, although the embodiment described above in relation to FIG. 1 and FIGS. 2A, 2B and 2C is directed to backside metallization of a wafer or substrate having features, such as a through wafer via, it is appreciated that the present invention can also be applied where backside metallization is performed over a flat or featureless surface. In general, the present invention can be advantageously applied where metallization of large areas in a semiconductor substrate and, in particular, where backside metallization is desired and a strong bond between the metal and the substrate is required.

Also, it is appreciated that certain details have been left out in order to not obscure the invention but that these details are known to those skilled in the art. Moreover, while the invention has been described with specific reference to certain embodiments, a person of ordinary skills in the art would appreciate that changes can be made in form and detail without departing from the spirit and the scope of the invention.

The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for metallization of a semiconductor substrate and related structure have been described.

What is claimed is:

1. A method for metallization of an area of a semiconductor substrate comprising steps of:
    depositing a layer of NiV over said area of said semiconductor substrate, said layer of NiV being in direct contact with said semiconductor substrate;
    depositing a first gold layer over said layer of NiV;
    depositing a second gold layer over said first gold layer.

2. The method of claim 1 wherein said semiconductor substrate comprises a group III–V compound semiconductor.

3. The method of claim 2 wherein said group III–V compound semiconductor is selected from the group consisting of gallium-arsenide, indium-phosphide, gallium-nitride, indium-arsenide, and gallium-antimony.

4. The method of claim 1 wherein said layer of NiV comprises between approximately 100% and approximately 80% nickel.

5. The method of claim 1 wherein said layer of NiV comprises between approximately 0% and approximately 20% vanadium.

6. The method of claim 1 wherein said layer of NiV has a thickness of between approximately 30 Angstroms and approximately 2000 Angstroms.

7. The method of claim 1 wherein said step of depositing said layer of NiV is performed in a deposition system selected from the group consisting of an RF magnetron, a DC magnetron, an RF diode, an ion beam, and an electron beam deposition systems.

8. The method of claim 1 further comprising a step of cleaning said area of said semiconductor substrate prior to said step of depositing said layer of NiV.

9. The method of claim 1 wherein said first gold layer has a thickness of between approximately 100 Angstroms and approximately 2500 Angstroms.

10. The method of claim 1 wherein said second gold layer has a thickness of between approximately 0.5 microns and approximately 25.0 microns.

11. The method of claim 1 wherein said semiconductor substrate includes a TWV.

12. The method of claim 1 wherein said area of said semiconductor substrate comprises a backside surface of said semiconductor substrate.

13. A method for metallization of an area in a semiconductor substrate comprising steps of:

depositing an NiV adhesion layer over said area in said semiconductor substrate, said semiconductor substrate comprising a group III–V compound semiconductor, said NiV adhesion layer being in direct contact with said semiconductor substrate;

depositing a gold seed layer over said NiV adhesion layer;

fabricating a second gold layer over said gold seed layer.

14. The method of claim 13 wherein said group III–V compound semiconductor is selected from the group consisting of gallium-arsenide, indium-phosphide, gallium-nitride, indium-arsenide, and gallium-antimony.

15. The method of claim 13 wherein said NiV adhesion layer comprises between approximately 100% and approximately 80% nickel.

16. The method of claim 13 wherein said NiV adhesion layer comprises between approximately 0% and approximately 20% vanadium.

17. The method of claim 13 wherein said NiV adhesion layer has a thickness of between approximately 30 Angstroms and approximately 2000 Angstroms.

18. The method of claim 13 wherein said step of depositing said NiV adhesion layer is performed in a deposition system selected from the group consisting of an RF magnetron, a DC magnetron, an RF diode, an ion beam, and an electron beam deposition systems.

19. The method of claim 13 further comprising a step of cleaning said area in said semiconductor substrate prior to said step of depositing said NiV adhesion layer so as to remove oxides from said area in said semiconductor substrate.

20. The method of claim 13 wherein said gold seed layer has a thickness of between approximately 100 Angstroms and approximately 2500 Angstroms.

21. The method of claim 13 wherein said second gold layer has a thickness of between approximately 0.5 microns and approximately 25 microns.

22. The method of claim 13 wherein said semiconductor substrate includes a TWV.

23. The method of claim 13 wherein said area in said semiconductor substrate comprises a backside surface of said semiconductor substrate.

* * * * *